United States Patent
Pflum et al.

(10) Patent No.: US 9,966,900 B2
(45) Date of Patent: May 8, 2018

(54) APPARATUS FOR OSCILLATOR WITH IMPROVED PRECISION AND ASSOCIATED METHODS

(71) Applicant: Silicon Laboratories Inc., Austin, TX (US)

(72) Inventors: Marty Pflum, Austin, TX (US); Arup Mukherji, Austin, TX (US); John M. Khoury, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days. days.

(21) Appl. No.: 15/238,525

(22) Filed: Aug. 16, 2016

(65) Prior Publication Data
US 2018/0054162 A1 Feb. 22, 2018

(51) Int. Cl.
| | |
|---|---|
| *H03K 3/03* | (2006.01) |
| *H03B 5/04* | (2006.01) |
| *H03L 7/00* | (2006.01) |
| *H03B 5/36* | (2006.01) |
| *H03B 27/00* | (2006.01) |
| *G06F 1/04* | (2006.01) |
| *H03B 1/00* | (2006.01) |
| *H03M 3/00* | (2006.01) |
| *G01R 19/00* | (2006.01) |

(52) U.S. Cl.
CPC ............. *H03B 5/04* (2013.01); *G01R 19/00* (2013.01); *G06F 1/04* (2013.01); *H03B 1/00* (2013.01); *H03B 5/36* (2013.01); *H03B 27/00* (2013.01); *H03L 7/00* (2013.01); *H03M 3/30* (2013.01)

(58) Field of Classification Search
CPC . H03L 7/00; G01R 19/00; G06F 1/04; H03M 3/30; H03B 5/36; H03B 1/00; H03B 27/00; H03B 5/04
USPC .......................................... 331/46, 55, 47, 2
See application file for complete search history.

(56) References Cited

U.S. PATENT DOCUMENTS

| | | | |
|---|---|---|---|
| 8,924,765 B2 | 12/2014 | Sheafor | |
| 2006/0223454 A1* | 10/2006 | Westwick | ................. H03L 7/00 455/76 |

OTHER PUBLICATIONS

U.S. Appl. No. 14/978,837, filed Dec. 15, 2015, Mukherji et al.
Application Note, Calibrating STM32F0x1, STM32F0x2, and STM32F0x8 lines internal oscillators, 27 pgs., 2015.
AVR1606: XMEGA Internal RC Oscillator Calibration, 10 pgs., 2009.
Application Note, AMX8X5 Family Autocalibration, 8 pgs., 2014.
AN244, Internal RC Oscillator Calibration, 10 pgs., 2003.

* cited by examiner

*Primary Examiner* — Arnold Kinkead
(74) *Attorney, Agent, or Firm* — Law Offices of Maximilian R. Peterson

(57) ABSTRACT

An apparatus includes a first oscillator to generate an output signal that has a first frequency. The apparatus further includes a second oscillator to generate an output signal that has a second frequency. The second frequency varies as a function of temperature. The apparatus further includes a controller that counts a number of cycles of the output signal of the second oscillator in order to determine whether to calibrate the first oscillator.

20 Claims, 10 Drawing Sheets

US 9,966,900 B2

APPARATUS FOR OSCILLATOR WITH IMPROVED PRECISION AND ASSOCIATED METHODS

TECHNICAL FIELD

The disclosure relates generally to oscillators and, more particularly, to apparatus for oscillators with improved precision, and associated methods.

BACKGROUND

Oscillators are used in a variety of electronic circuits. For example, analog circuitry may use an oscillator for functions such as timekeeping, sampling, etc. As another example, digital circuitry may use an oscillator as a source of clock signals. As another example, mixed-signal or mixed-mode circuitry may use one or more oscillators to generate timekeeping signals, sampling signals, clock signals, and the like.

A real life, practical implementation of an oscillator deviates from an ideal model. For example, output signals of practical oscillators may vary in frequency and/or amplitude based on a number of electrical or environment factors. The electrical factors include supply voltage variations, load variations, etc. The environmental factors include temperature changes, shock, etc.

The description in this section and any corresponding figure(s) are included as background information materials. The materials in this section should not be considered as an admission that such materials constitute prior art to the present patent application.

SUMMARY

A variety of apparatus for oscillators with improved precision and associated methods are contemplated. According to one exemplary embodiment, an apparatus includes a first oscillator to generate an output signal that has a first frequency. The apparatus further includes a second oscillator to generate an output signal that has a second frequency. The second frequency varies as a function of temperature. The apparatus further includes a controller that counts a number of cycles of the output signal of the second oscillator in order to determine whether to calibrate the first oscillator.

According to another exemplary embodiment, an apparatus includes a first oscillator to generate an output signal that has a first frequency, and a second oscillator to generate an output signal that has a second frequency. The second frequency has higher sensitivity to temperature variation than does the first frequency. The apparatus further includes a controller to calibrate the first oscillator by counting a number of cycles of the output signal of a third oscillator when a number derived from variation in the second frequency exceeds a threshold.

According to another exemplary embodiment, a method of improving precision of a first oscillator includes performing a base calibration of the first oscillator. The method further includes using a second oscillator to determine whether a change in temperature exceeds a threshold. The method additionally includes recalibrating the first oscillator when the change in temperature exceeds the threshold.

BRIEF DESCRIPTION OF THE DRAWINGS

The appended drawings illustrate only exemplary embodiments and therefore should not be considered as limiting the scope of the application or the claims. Persons of ordinary skill in the art will appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate generally to signal generation circuitry, such as oscillators. More specifically, the disclosed concepts provide apparatus and methods for oscillators with improved precision and associated methods.

Oscillators according to some exemplary embodiments may be free-running oscillators. For example, in some embodiments, the oscillator(s) may be used as a reference source or clock for RTCs. In other exemplary embodiments, the oscillator(s) may operate in an intermittent or gated manner, as desired.

Generally, circuitry and techniques according to exemplary embodiments use an oscillator with a relatively high frequency, called without limitation a high frequency (HF) oscillator to facilitate description in this document. The HF oscillator is used to improve precision of an oscillator with a relatively low frequency (e.g., compared to the frequency of the HF oscillator), called without limitation a low frequency (LF) oscillator to facilitate description in this document. The labels "HF oscillator" and "LF oscillator," however, are not meant to place limits on the frequencies of the respective oscillators. They merely provide a convenient way of denoting that the output frequency of the LF oscillator is lower than the output frequency of the HF oscillator.

Figure 1:
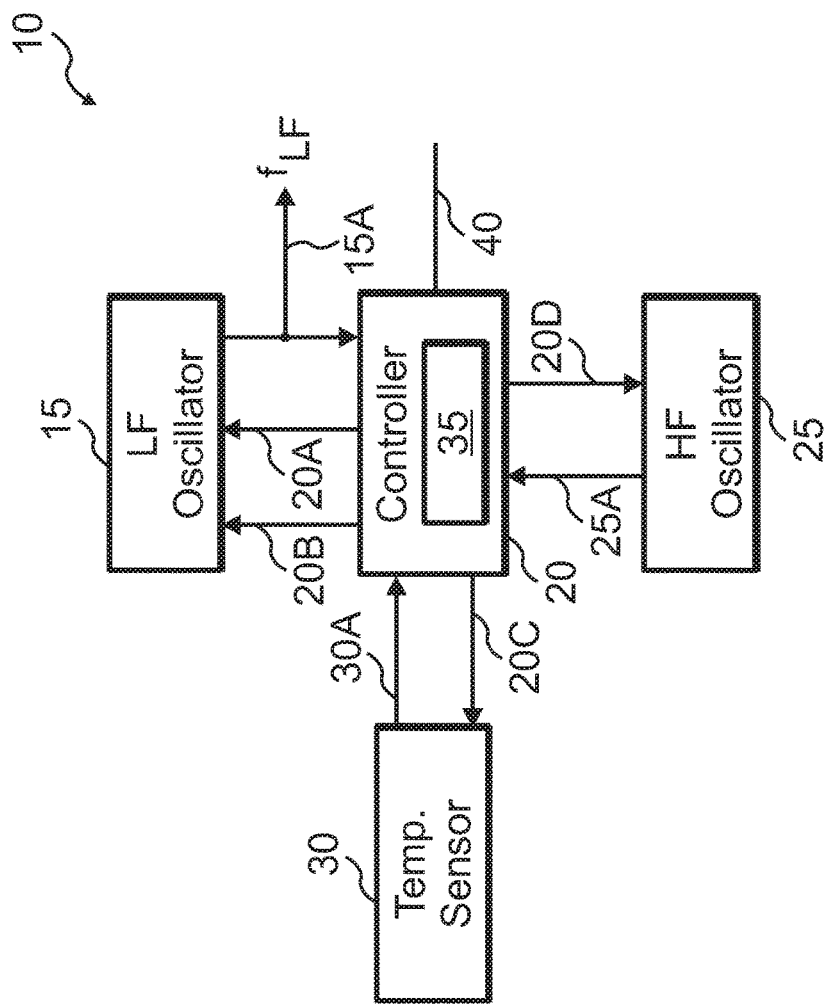
FIG. 1 illustrates a signal generator circuit according to an exemplary embodiment.

FIG. 1 illustrates a signal generator circuit 10 according to an exemplary embodiment. Signal generator circuit 10 includes LF oscillator 15, controller 20, HF oscillator 25, and temperature sensor or detector circuit 30.

LF oscillator 15 provides an output signal for signal generator circuit 10, denoted as output signal 15A (labeled "$f_{LF}$" in FIG. 1). Controller 20 controls or governs the operation of signal generator circuit 10. More specifically, controller 20 uses signal 20A to calibrate the frequency of output signal 15A of signal generator circuit 10, as described below in detail. Calibration (or recalibration) of LF oscillator 15 corrects or compensates for environmental changes (e.g., changes in temperature) that cause variations in the frequency of output signal 15A, as described below in detail. Controller 20 receives output signal 15A of LF oscillator 15 to perform calibration of output signal 15A, as described below in detail.

In the embodiment shown, controller 20 uses signal 20B to enable or disable operation of LF oscillator 15. In some embodiments, signal 20B controls whether LF oscillator 15, in part or entirely, is powered up or placed in a low power or sleep mode (compared to normal or full power mode of operation, i.e., when LF oscillator 15 oscillates and provides output signal 15A). In some embodiments, LF oscillator 15 remains powered, and signal 20B is used to gate output signal 15A. As persons of ordinary skill in the art will understand, in situations where free-running operation of LF oscillator 15 is desired, signal 20B may be omitted.

Controller 20 uses signal 20D to control the operation of HF oscillator 25. By using signal 20D, controller 20 can control whether HF oscillator 25 provides an output signal 25A (provided to controller 20). In some embodiments, signal 20D controls whether HF oscillator 25, in part or entirely, is powered up or placed in a low power or sleep mode (compared to normal or full power mode of operation, i.e., when HF oscillator 25 oscillates and provides output signal 25A). In some embodiments, HF oscillator 25 remains powered, and signal 20D is used to gate output signal 25A.

HF oscillator 25 may be implemented using a variety of circuitry. The choice of circuitry for a given implementation depends on a variety of factors, as persons of ordinary skill in the art will understand. Such factors include design specifications, performance specifications, cost, IC or device area, available technology, such as semiconductor fabrication technology), target markets, target end-users, etc.

In some embodiments, HF oscillator 25 constitutes a crystal oscillator. In such embodiments, signal 20D may be used to cause parts of the crystal oscillator to power down. In some embodiments, the entire crystal oscillator circuitry may be powered down in response to signal 20D. In some embodiments, part of the crystal oscillator circuitry (e.g., the circuitry used to cause oscillation) may remain powered, whereas other parts of the crystal oscillator circuitry (e.g., buffers) may be powered down or placed in a low power or sleep mode. Generally, an HF oscillator that uses a crystal has higher precision than an LF oscillator that does not use a crystal. In some embodiments, LF oscillator 15 is a resistor-capacitor (RC) based oscillator. Given the relatively large variability in resistance and capacitance compared to the oscillation frequency of a crystal, in such situations HF oscillator 25 has higher (typically far higher, for example, orders of magnitude) precision than does an RC-based LF oscillator 15.

Temperature sensor 30 provides an output signal 30A to controller 20. Output signal 30A provides an indication of the temperature of signal generator circuit 10. For example, in some embodiments, various blocks and components of signal generator circuit 10 are integrated within an integrated circuit (IC) or within a semiconductor die, generally integrated in relatively close proximity to one another. In such a situation, temperature sensor 30 provides a reasonable approximation of the overall temperature of the various blocks and components of signal generator circuit 10, such as LF oscillator 15. Controller 20 uses output signal 30A of temperature sensor 30 to determine whether to calibrate LF oscillator 15, as described below in detail.

Controller 20 uses signal 20C to control the operation of temperature sensor 30. In some embodiments, signal 20C controls whether temperature sensor 30, in part or entirely, is powered up or placed in a low power or sleep mode (compared to normal or full power mode of operation, i.e., when temperature sensor 30 provides output signal 30A). In some embodiments, temperature sensor 30 remains powered, and signal 20C is used to gate output signal 30A.

In the embodiment shown in FIG. 1, controller 20 includes one or more configuration registers 35. Configuration registers 35 store various parameters or variables relating to the operation of controller 20 and, generally, of signal generating circuit 10. Examples include the amount of temperature change (threshold) before calibration is performed again, the number of periods of various signals to count (described below in detail), the delay between checks to determine the amount of temperature change, and/or other parameters or variables described in this document.

Configuration registers 35 may be set via a link 40. A device (not shown) may couple via link 40 to controller 20 and program (or set or configure) the contents of one or more of configuration registers 35. The device may also provide control signals to controller 20 via link 40. The control signals may program (or set or configure) one or more aspects of the operation of controller 20, such as whether to put one or more components of signal generating circuit 10 in a low power or sleep mode, whether to perform an initial or base calibration of LF oscillator 15A (e.g., as power up), etc.

In some embodiments, the device (not shown) may also use link 40 to receive information from controller 20. Examples of such information include the contents of one or more configuration registers 35, status information, results of calibration (e.g., the amount of drift in the frequency of output signal 15A that was corrected by the calibration procedure), temperature (as determined by temperature sensor 30), etc.

As noted above, in some embodiments, one or more of the blocks, circuitry, or components of signal generating circuit 10 may be operated periodically in a low power or sleep mode of operation. This properly may be used when, for example, signal generating circuit 10 is included in (e.g., integrated in an IC) that includes other circuitry that operates in normal and low power modes of operation. For example, in some embodiments, such circuitry or IC may have several modes of operation, such as EM0 (normal or high power mode of operation in which, for instance, a processor or central processing unit (CPU) of the IC is running), EM1 (some or most of the circuitry in the IC running or powered on, without the processor or CPU running), EM2 (sleep mode, where some of the circuitry in the IC is in the low power or sleep mode of operation), and EM3 (deep sleep mode, where most of the circuitry in the IC is in the low power or sleep mode of operation). In such embodiments, signal generating circuit 10 operates in energy modes EM0, EM1, EM2, and EM3, but the most power is saved (i.e., power consumption is reduced) by staying in the EM2 and EM3 modes.

As noted above, controller 20 calibrates LF oscillator 15. In exemplary embodiments, controller 20 calibrates LF oscillator by causing the period of output signal 15A (or, conversely, its frequency) to vary. Controller 20 changes the period via signal 20B. Signal 20B may change the period through a number of mechanisms. For example, in some embodiments, signal 20B may cause one or more resistor, capacitor, or current values (e.g., as provided by current source(s)) to change, thus resulting in corresponding changes in the period of output signal 15A. As another example, in some embodiments, a comparator is used in LF oscillator 15 to generate output signal 15A. Signal 20B causes changes in the trip or threshold point(s) of the comparator and, thus, causes the period (or frequency) of output signal 15A to change. Further details and examples may be obtained from U.S. application Ser. No. 14/978,837, filed on Dec. 22, 2015.

Generally, a number of techniques or topologies of oscillator may be used to implement LF oscillator 15 such that it dithers (in response to control signal 20A) between a short and long period (corresponding to higher and lower frequencies of output signal 15A, respectively). The choice of circuitry for a given implementation depends on a variety of factors, as persons of ordinary skill in the art will understand. Such factors include design specifications, performance specifications, cost, IC or device area, available technology, such as semiconductor fabrication technology), target markets, target end-users, etc.

The dithering mentioned above is controlled by controller 20, using a set of values (corresponding to a control word FINETRIM). In other words, a control word FINETRIM, which includes a set of bits, is used to trim (or tune or vary or control or change) the frequency ($f_{LF}$) of output signal 15A and, thus, calibrate output signal 15A. More specifically, FINETRIM is used to provide a stream of bits to LF oscillator 15 (e.g., in the form of control signal 20A) to trim the frequency ($f_{LF}$) of output signal 15A, as described below in detail.

In some embodiments, the FINETRIM signals may have 13 bits (corresponding to 8,192 unique values), although other numbers of bits and configurations may be used, as desired. The choice of circuitry and configuration for a given implementation depends on a variety of factors, as persons of ordinary skill in the art will understand, such as design specifications, performance specifications (e.g., the resolution in the frequency change of output signal 15A), cost, IC or device area, available technology, such as semiconductor fabrication technology), target markets, target end-users, etc.

Figure 2:
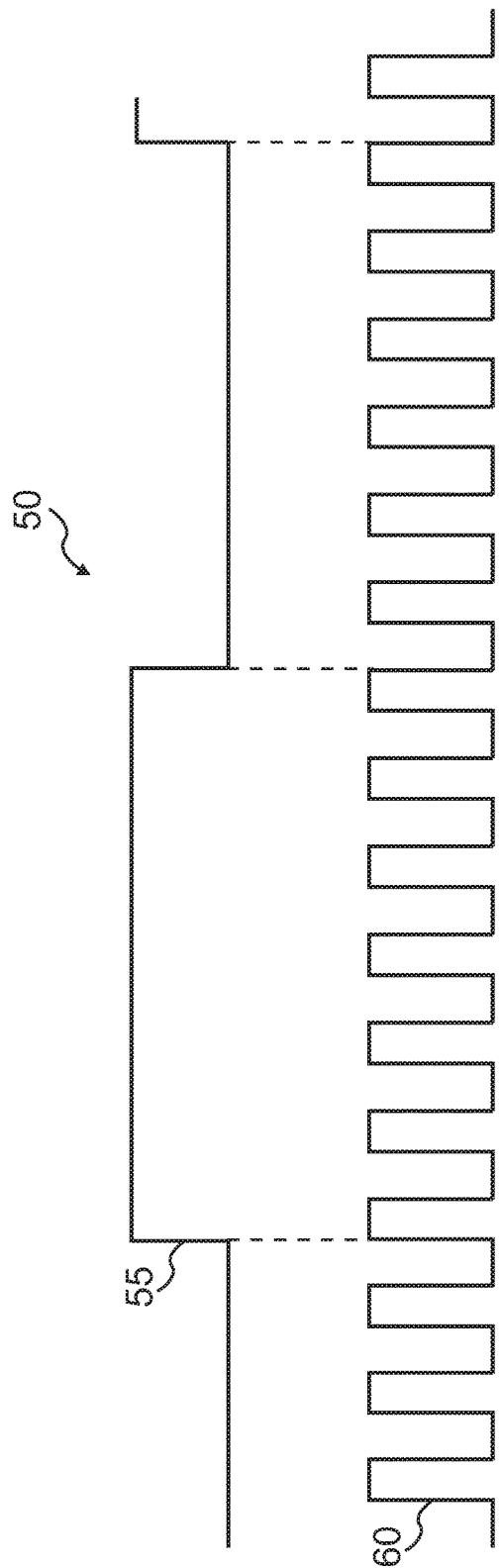
FIG. 2 depicts waveforms corresponding to signals used to calibrate an oscillator according to an exemplary embodiment.

Controller 20 calibrates LF oscillator 15 using output signal 25A of HF oscillator 25. As noted above, output signal 25A has a higher frequency than does output signal 15A of LF oscillator 15. FIG. 2 shows waveforms corresponding to output signal 15A and output signal 25A. More specifically, waveform 55 corresponds to output signal 15A, whereas waveform 60 corresponds to output signal 25A. During a single cycle of waveform 55, waveform 60 exhibits a number of cycles.

Controller 20 counts the number of cycles of output signal 25A during a given number of cycles of output signal 15A. In some embodiments, the number of cycles of output signal 15A is programmable (e.g., by using configuration registers 35). By comparing the count against a nominal count (i.e., corresponding to output signal 15A having a frequency of exactly 32.768 kHz), controller 20 determines whether the frequency of output signal 15A is too high or too low (compared to the nominal output frequency). Controller 20 uses the result of that determination to modify the value of FINETRIM and, thus, change the frequency of output signal 15A, as described below in detail. In this manner, controller 20 calibrates the frequency of oscillation of LF oscillator 15A. In some embodiments, the number of cycles of output signal 15A during which cycles of output signal 25A are counted is programmable (e.g., by using configuration registers 35). For example, in some embodiments, the cycles of output signal 25A are counted during 300 cycles of output signal 15A.

A variety of frequencies may be used for output signal 15A and output signal 25A, depending on factors such as design and specifications (e.g., desired resolution in the calibration of LF oscillator 15), cost, available technology or components (e.g., the characteristics of crystal oscillators available), etc. In some embodiments, output signal 15A may have a frequency of 32.768 kHz, whereas output signal 25A may have a frequency of 38.4 MHz. Thus, for oscillators corresponding to such an example, a single cycle of output signal 15A corresponds to over 1,171 cycles of output signal 25A.

The higher the ratio of the frequency of output signal 15A to the frequency of output signal 25A, the better the calibration resolution of LF oscillator 15, and vice-versa. Generally speaking, however, relatively high frequencies for output signal 25A result in higher amounts of power consumption, for example, in the circuitry in HF oscillator 25. To reduce power consumption, in some embodiments, controller 20 uses signal 20D to periodically turn on HF oscillator 25. During the time that HF oscillator 25 is powered on, the number of cycles of output signal 25A are counted, as described above. When the counting has concluded, HF oscillator 25 is powered off to reduce power consumption. HF oscillator 25 is turned on again for recalibration, as described below in detail.

In exemplary embodiments, temperature sensor 30 includes a temperature sensitive oscillator (TSO). More specifically, the frequency of oscillation of the temperature sensitive oscillator in temperature sensor 30 varies in response to changes in temperature. In such embodiments, the temperature sensitive oscillator is designed or configured to have a larger output frequency variation or sensitivity in response to a given change in temperature than does LF oscillator 15. Stated another way, the slope of the function describing the output frequency of the temperature sensitive oscillator as a function of temperature is larger than the corresponding slope for LF oscillator 15 (and HF oscillator 25).

The temperature sensitive oscillator may be implemented in a variety of ways, as persons of ordinary skill in the art will understand. For example, in some embodiments, the temperature sensitive oscillator may include components, such as resistors, capacitors, and/or current sources that have relatively large gradients or slopes with respect to changes in temperature. As is well known in the art, the resistivity of circuit resistors varies with respect to temperature and is modeled with a temperature coefficient. This property may be used in some embodiments to implement a TSO. Typically, one type of resistor with a positive coefficient is used with another type of resistor with a negative coefficient together so that the resistors offset the other's temperature coefficient. As the oscillating circuit voltage ramps up, it uses a different resistor compared to when the voltage ramps down. As the triangular waveform ramps up and down, half the time is with the positive coefficient and half the time is with the negative coefficient. For the TSO to reflect or measure temperature changes, it designed to have increased oscillator frequency variation with temperature, so a sawtooth waveform would be used instead of a triangular waveform. The negative coefficient and the positive coefficient resistors would not be balanced against each other since the TSO is designed to have more frequency variation as a function of changes in temperature.

The output signal of the temperature sensitive oscillator is used for recalibration of LF oscillator 15. In other words, controller 20 turns on the temperature sensitive oscillator, measures the cycles of the output signal of the temperature sensitive oscillator for a given period of time, and compares the resulting count to a count for a previous (last) measurement. The difference in the count values (if any) indicates the amount (if any) of temperature change. A variety of frequencies may be used for the output signal of the temperature sensitive oscillator. In some embodiments, the output signal of the temperature sensitive oscillator has a frequency of 5 MHz.

Figure 3:
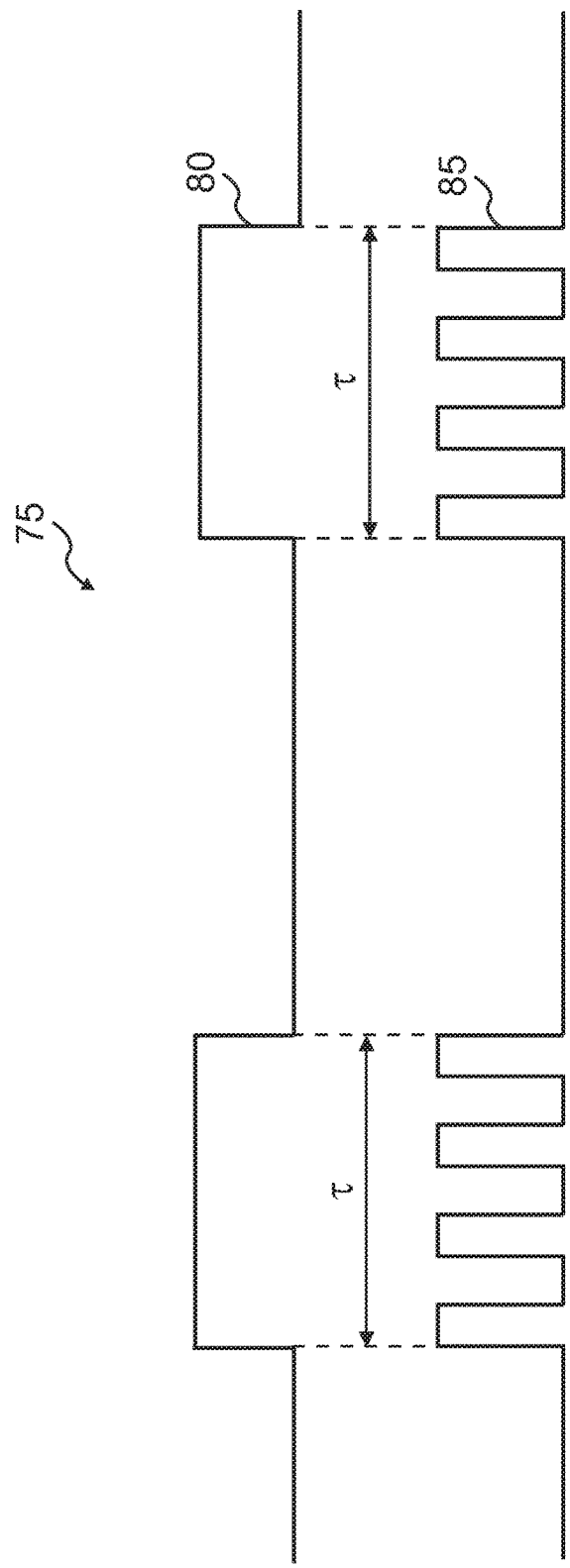
FIG. 3 shows waveforms corresponding to additional signals used to calibrate an oscillator according to an exemplary embodiment.

To reduce power consumption, controller 20 uses signal 20C to turn off the temperature sensitive oscillator until a determination of temperature is desired. At that time, controller 20 uses signal 20C to turn on the temperature sensitive oscillator for a period (say, τ) to perform temperature measurement, as described above. Once the temperature measurement has concluded, controller 20 turns off the temperature sensitive oscillator. FIG. 3 shows waveforms corresponding to this sequence of operations. Waveform 80 corresponds to signal 20C, whereas waveform 85 depicts the output signal of the temperature sensitive oscillator. In some embodiments, the period of time during which temperature is measured (the cycles of the output signal of the temperature sensitive oscillator are counted) is programmable (e.g., by using configuration registers 35 (see FIG. 1)). Furthermore, in some embodiments, the period of time between temperature measurements is programmable (e.g., by using configuration registers 35 (see FIG. 1)).

Figure 4:
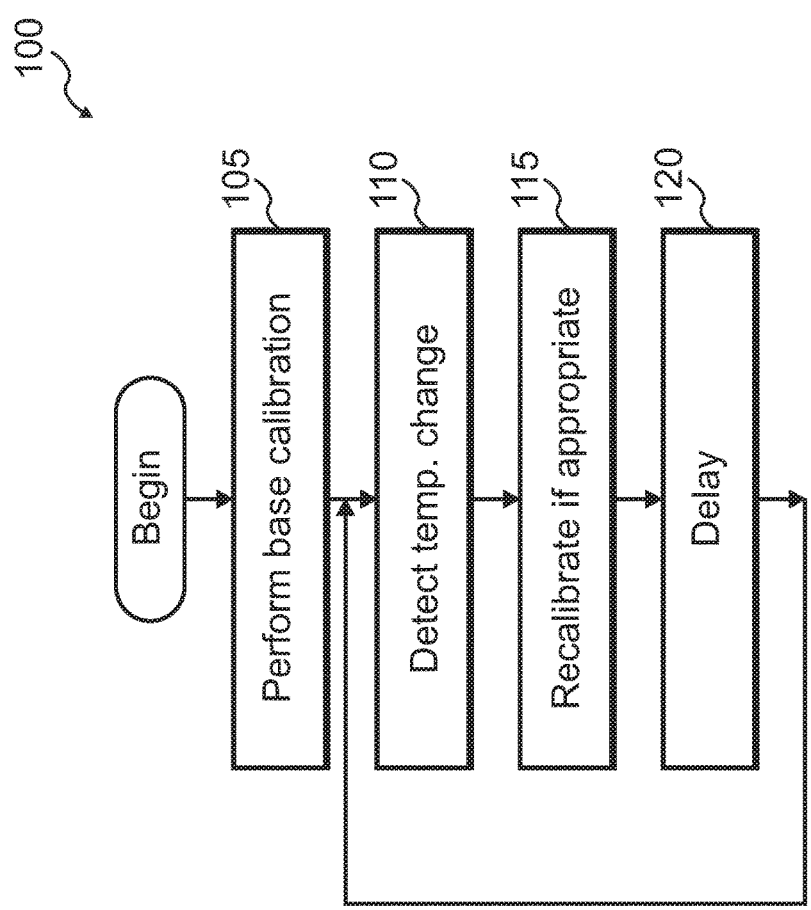
FIG. 4 depicts a flow diagram for a process of calibrating an oscillator according to an exemplary embodiment.
Figure 5:
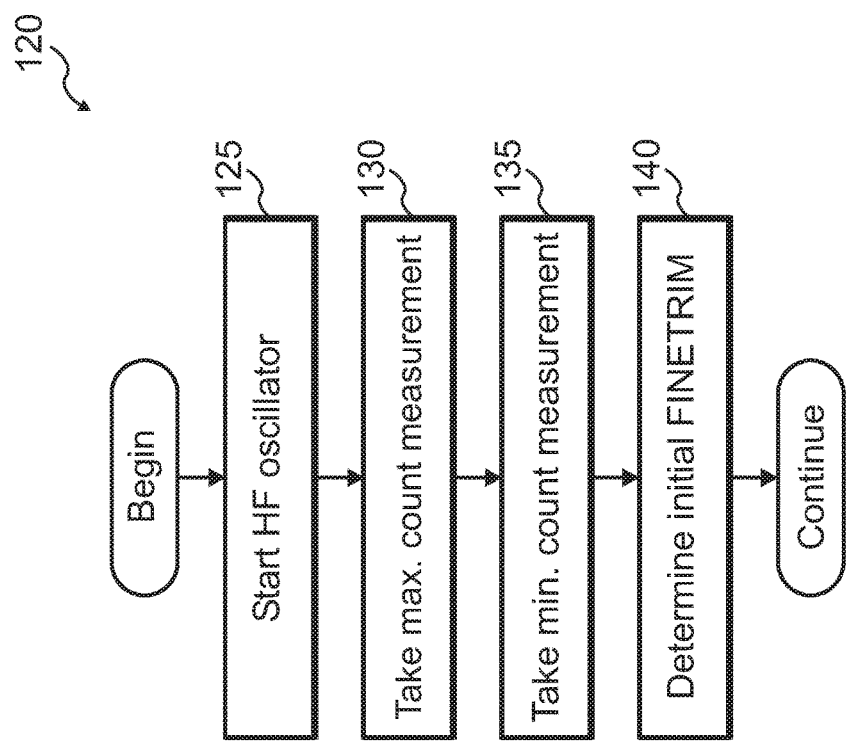
FIG. 5 illustrates a flow diagram for a process of base calibration according to an exemplary embodiment.
Figure 6:
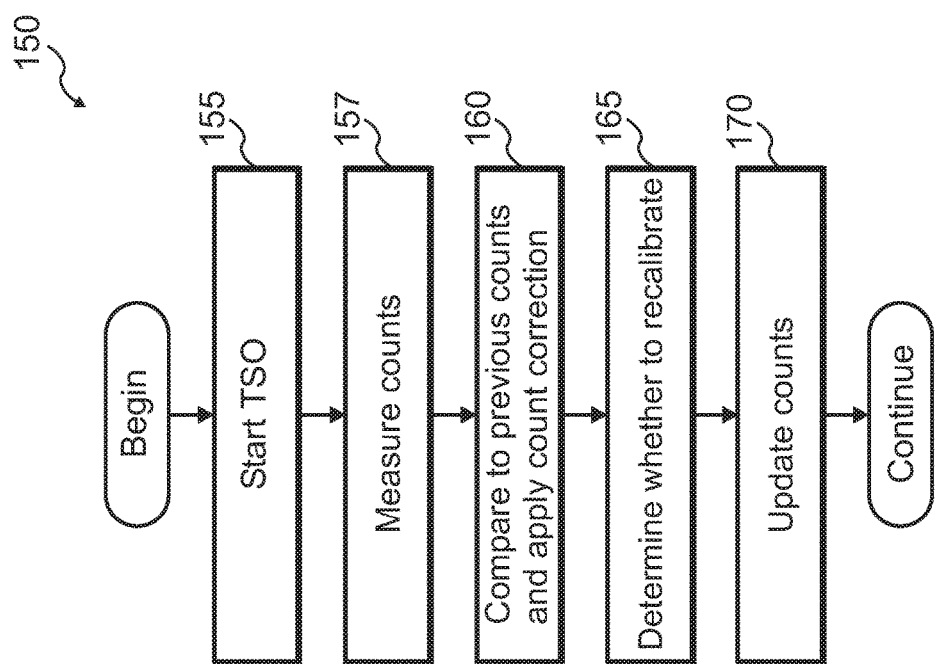
FIG. 6 depicts a flow diagram for a process of detecting temperature change according to an exemplary embodiment.
Figure 7:
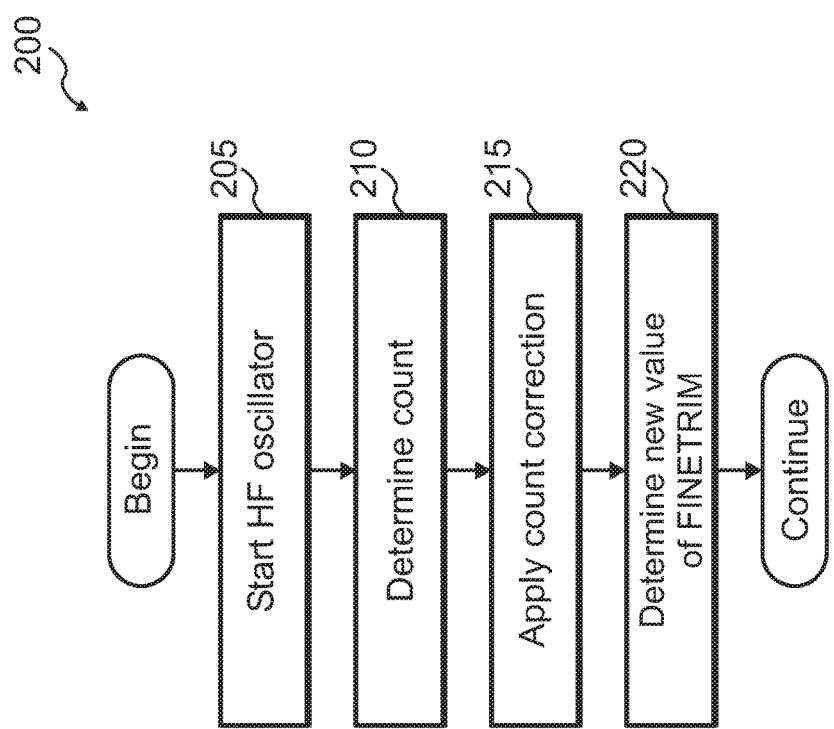
FIG. 7 illustrates a flow diagram for a process of recalibration according to an exemplary embodiment.

Generally speaking, the process of calibrating LF oscillator 15 includes a base calibration, temperature measurement, and recalibration. FIG. 4 shows a flow diagram 100 of the overall process (FIGS. 5-7 provides details of each sub-process). Referring, at 105, base calibration of LF oscillator 15 is performed. The base calibration measures the temperature, as described above, and determines an initial value for FINETRIM. The value of FINETRIM is used to calibrate LF oscillator 15, as described above.

As noted, the frequency of output signal 15 of LF oscillator 15 changes in response to temperature variations. At 110, temperature changes (if any) are detected. As described above, temperature sensor 30 (e.g., including a temperature sensitive oscillator) may be used to determine the change, if any, in temperature. The absolute value of the change in temperature is compared to a threshold value. In some embodiments, the threshold value is programmable (e.g., by using configuration registers 35). For example, the threshold value may be programmed (or fixed, as desired) to 3° C., 2° C., or other desired values.

Referring to the comparison of the change in temperature to the threshold value, if the absolute value of the change in temperature exceeds the threshold value, at 115 recalibration is performed. The smaller the threshold value, the more frequent the calibration of LF oscillator 15, and hence the more precise is the frequency of output signal 15A. On the other hand, given that calibrating LF oscillator 15 entails using HF oscillator 25 and, hence, consuming power, larger threshold values trade off the precision of the frequency of output signal 15A with power consumption of signal generating circuit 10.

Following recalibration, if any, at 120 the process is delayed for a period of time. Following the delay period, temperature change is again detected at 110. In some embodiments, the delay period is programmable (e.g., by using configuration registers 35). The smaller the delay period, the more responsive the calibration of LF oscillator 15 to changes in temperature, and vice-versa. On the other hand, given that detecting temperature changes and calibrating LF oscillator 15 entails using HF oscillator 25 and temperature sensor 30 and, hence, consuming power, larger delay periods trade off responsiveness with power consumption of signal generating circuit 10.

FIG. 5 illustrates a flow diagram 120 for the base or initial calibration process according to an exemplary embodiment. At 125, HF oscillator 25 is started, and allowed to stabilize and produce output signal 25A. Next, counts of cycles of output signal 25A that correspond to long and short cycles of output signal 15A are calculated. In other words, at 130, the period of output signal 15A of LF oscillator 15 is programmed to a value that corresponds to the longest expected period (e.g., the period corresponding to the lowest frequency $f_{LF}$ expected to be encountered as a function of temperature changes). To perform the counting, controller 20 provides a binary 1 to LF oscillator 15 as control signal 20E. Cycles of output signal 25A are counted to generate a value $COUNT_{max}$ (longer cycles of output signal 15A result in more cycles of output signal 25A being counted, hence the label $COUNT_{max}$).

Similarly, at 135, the period of output signal 15A of LF oscillator 15 is programmed to a value that corresponds to the shortest expected period (e.g., the period corresponding to the highest frequency $f_{LF}$ expected to be encountered as a function of temperature changes). To perform the counting, controller 20 provides a binary 0 to LF oscillator 15 as control signal 20E. Cycles of output signal 25A are counted to generate a value $COUNT_{min}$ (shorter cycles of output signal 15A result in fewer cycles of output signal 25A being counted, hence the label $COUNT_{min}$). Note that in some embodiments the order of the counts may be reversed (i.e., measuring $COUNT_{min}$, followed by measuring $COUNT_{max}$, as desired.

To generate an initial value for FINETRIM, a value DIFF is calculated as the difference between $COUNT_{max}$ and $COUNT_{min}$, i.e., $$DIFF = COUNT_{max} - COUNT_{min}.$$

An initial value of FINETRIM, $FINETRIM_{init}$, is calculated as:

$$FINETRIM_{init} = (COUNT_{NOM} - COUNT_{min})/DIFF,$$

where $COUNT_{NOM}$ represents a count corresponding to the desired period of output signal 15A (i.e., $COUNT_{NOM}$ corresponds to the number of cycles of output signal 25A being counted during a period of time that corresponds to the desired frequency $f_{LF}$). The initial value of FINETRIM, $FINETRIM_{init}$ is used to trim (or tune or vary or control or change) the frequency $f_{LF}$ to the desired value (or approximately the desired value in a practical implementation). As a result, LF oscillator 15 is calibrated.

As noted above, the frequency of output signal 15A, i.e., $f_{LF}$, changes as a function of temperature. The calibration procedure detects changes in temperature, if any, as described above, to determine whether recalibration should be performed. FIG. 6 depicts a flow diagram 150 for a process of detecting temperature change according to an exemplary embodiment.

At 155, the temperature sensitive oscillator (e.g., included in temperature sensor 30, as discussed above) is started and allowed to stabilize. At 157, counts of cycles of the temperature sensitive oscillator are performed. More specifically, the first time the temperature sensitive oscillator is run (or when the base calibration is performed), the number of cycles of the temperature sensitive oscillator are counted for a given period of time ($t_{meas}$) and the resulting number is saved as $N_1$. Subsequently when the temperature sensitive oscillator is run, the number of cycles of the temperature sensitive oscillator are counted for the period of time ($t_{meas}$), and the resulting number is saved as $N_2$. Each subsequent time that the temperature sensitive oscillator is run and the temperature variation is greater than a threshold, $N_1$ is set to the then-current value of $N_2$, and a new value for $N_2$ is measured.

In exemplary embodiments, the period of time during which the temperature sensitive oscillator is run ($t_{meas}$) in order to measure counts ($N_1$, $N_2$) is programmable (e.g., by using configuration registers 35 (see FIG. 1)). For example, in some embodiments, ($t_{meas}$) is selected to correspond to a desired or given number of cycles ($N_{meas}$) of the temperature sensitive oscillator, for instance, 50 (i.e., $N_{meas}$=50).

Referring again to FIG. 6, at 160, the current count ($N_2$) is compared to the previous count ($N_1$). To determination temperature change, the relative values of the counts are used, rather than correlating the counts to actual temperature values. More specifically, the quantity ($N_1 \cdot N_2 \cdot K_{temp}$) is calculated and compared to $|N_2-N_1|$ the absolute value of ($N_2-N_1$). The quantity $K_{temp}$ is selected by characterizing the temperature sensitive oscillator such that nominal values of $N_1$ and $N_2$ result in the desired temperature change threshold (e.g., a change in temperature of 2° C., 3° C., etc., as discussed above).

If ($N_1 \cdot N_2 \cdot K_{temp}$) is larger than $|N_2-N_1|$, then temperature has changed sufficiently to warrant recalibration. Otherwise, no recalibration is to be performed. For example, suppose that N2=7,629, N1=7,660, and $K_{temp}$=6.2×10$^{-7}$. In other words, ($N_1 \cdot N_2 \cdot K_{temp}$)=36, and $|N_2-N_1|$=31. Given that ($N_1 \cdot N_2 \cdot K_{temp}$) is larger than $|N_2-N_1|$, no recalibration will be performed.

In some embodiments, a correction may be applied to the measured count values. The correction may be used in situations where $N_{meas}$ is relatively small (compared to the number of cycles implied by the number of bits in FINETRIM for calibration of LF oscillator 15). Consider, for example, the situation where FINETRIM includes 13 bits, implying that a total of 8,192 (2$^{13}$) cycles should be needed to get the precise frequency with the bits in FINETRIM dithering. When a shorter number of cycles are used for Nmeas (e.g., 50) for the temperature count measurement, the measurement period might be slightly off. For example if the FINETRIM value was 0.5703, a 50-cycle measurement period would provide a dithering of 0.56 or 0.58. In such a situation, the number of ones in FINETRIM (as provided by controller 20, and discussed below in more detail) is counted during the measurement period and used to calculate the actual dithering ratio. The difference between the actual and measured dithering ratios (FINETRIM) is used by the temperature detection algorithm to correct the measured counts. In the exemplary embodiment described (3% frequency variation in $f_{LF}$), the maximum period of one cycle would be approximately 3% longer than 30.518 µs (1/32.768 kHz) while the minimum would be approximately 3% shorter than 30.518 µs. The 3% variation itself varies slightly with from part to part. Each cycle from LF oscillator 15 is either a long or short cycle (in response to the bit pattern provided to LF oscillator 15). Dithering refers to the period of output signal 15A alternating between long and short cycles at some ratio. For example, a dithering ratio (FINETRIM) of 0.5 for FINETRIM means that every other cycle from LF oscillator 15 was a long cycle while the other cycles were short cycle. As another example, a dithering ratio (FINETRIM) of 0.33 would mean that two consecutive cycles would be short and the third would be a long cycle.

At 170, the counts are updated. More specifically, as noted above, the value of $N_2$ is saved as (assigned to) $N_1$ when the measured count difference ($N_2-N_1$) is greater than ($N_1 \cdot N_2 \cdot K_{temp}$). (In a subsequent temperature change detections, a new value of $N_2$ is calculated, corresponding to the temperate at that time.)

As noted, in some embodiments, signal generating circuit 10 may be integrated or associated with processing circuitry having various power or energy states.

In such embodiments, the processor and/or other parts of the overall circuitry (e.g., IC) may be in a sleep mode while the temperature change detection is performed.

In exemplary embodiments, as described above, if the temperature change exceeds a threshold, recalibration of LF oscillator 15 is performed. FIG. 7 depicts a flow diagram 200 for a process of recalibrating LF oscillator 15 according to an exemplary embodiment.

At 205, HF oscillator 25 is started, and allowed to stabilize and produce output signal 25A. Next, at 210, cycles of output signal 25A are counted during a specified or desired time period to generate a count value COUNT$_{MEAS}$. In exemplary embodiments, the time period for counting cycles of output signal 25A is programmable (e.g., by using configuration registers 35 (see FIG. 1)).

Referring again to FIG. 7, at 215, a correction is applied to the measured count (COUNT$_{MEAS}$). The correction is applied where the number of cycles of output signal 15A (of LF oscillator 15) during which the cycles of output signal 25A (of HF oscillator 25) are counted is relatively small compared to the number of values that the FINETRIM signal represents (e.g., 2$^{13}$, or 8,192 values for a 13-bit FINETRIM). More specifically, a corrected count, COUNT$_{CORRECTED}$, is calculated as COUNT$_{CORRECTED}$=COUNT$_{MEAS}$+DIFF×(FINETRIM−(COUNT$_{ONES}$/calibration_period)), where COUNT$_{ONES}$ denotes the number of binary ones that controller 20 provides to LF oscillator 15 during the measurement period, and calibration_period denotes the number of LE cycles used to measure a given count. The value of calibration_period may be varied depending on factors such as the desired level of accuracy versus the power consumption HF oscillator 25. For example, in some embodiments, calibration_period may have a value of 200. As another example, in some embodiments, calibration_period may have a value of 300. Generally, the value calibration_period is selected so as to provide a desired or specified level of accuracy while meeting a desired or specified level of power consumption from running HF oscillator 25.

At 220, a new value of FINETRIM is calculated. More specifically, the new value of FINETRIM, FINETRIM$_{NEW}$, is calculated as {FINETRIM$_{PREV}$+(COUNT$_{NOM}$−COUNT$_{CORRECTED}$)/DIFF}, where FINETRIM$_{PREV}$ represents the previous value of FINETRIM (e.g., when the recalibration process was last performed). The new value of FINETRIM, i.e., FINETRIM$_{NEW}$, is the new dithering ratio that controls the number of long and short cycles of the LF oscillator 15 to account for the change in temperature.

Figure 8:
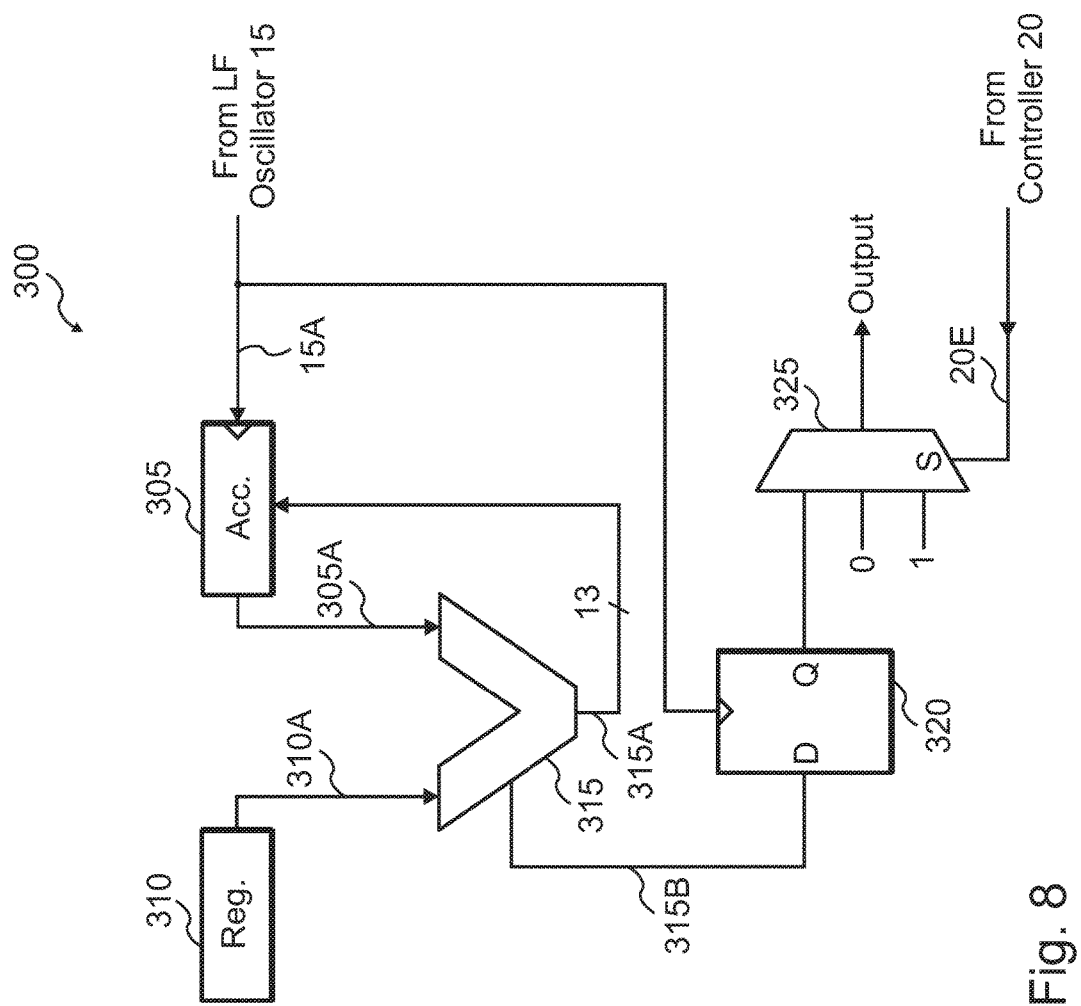
FIG. 8 shows a circuit arrangement for a bit pattern generator according to an exemplary embodiment.

Referring again to FIG. 1, as noted, controller 20 uses the signal FINETRIM to provide control signal 20A to LF oscillator 15 in order to trim the frequency of output signal 15A. In some embodiments, controller 20 uses a bit pattern generator to provide control signal 20A. The bit pattern generator may be included in controller 20 or, alternatively, may be implemented as a separate circuit. FIG. 8 shows a circuit arrangement for a bit pattern generator 300 according to an exemplary embodiment.

Bit pattern generator 300 includes a register 310 that stores FINETRIM. Bit pattern generator 300 also includes accumulator 305. In response to a clock signal (output signal 15A of LF oscillator 15), accumulator 305 accumulates or stores the output of adder 315 (labeled 315A). Output 305A of accumulator 305 feeds one input of adder 315. Register 310 provides output signal 310A (FINETRIM) to another input of adder 315.

A carry-out output (labeled 315B) of adder 315 feeds an input of flip-flop 320. Output signal 15A of LF oscillator 15 clocks flip-flop 320. The output of flip-flop 320 feeds one input of multiplexer (MUX) 325. A binary 0 feeds a second input of MUX 325, whereas a binary 1 feeds a third input of MUX 325. Control signal 20E (not shown in FIG. 1; might be internal to controller 20 (if the bit pattern generator is included in controller 20, or conversely might be external to controller 20), provided by controller 20, constitutes the select signal of MUX 325. In other words, controller 20 can cause MUX 325 to provide as the output of bit pattern generator 300 either a binary 0 (to cause a short period of oscillation in output signal 15A, as described above), a binary 1 (to cause a long period of oscillation in output signal 15A, as described above), or the output of flip-flop 320 (to trim the frequency of output signal 15A based on the value of FINETRIM).

Note that bit pattern generator 300 represents merely one way of trimming the frequency of output signal 15A. Generally, the circuitry in controller 20 may be implemented in a variety of ways, as persons of ordinary skill in the art will understand. For example, in some embodiments, one or more finite state machines (FSMs) may be used. As another example, in some embodiments, a custom arithmetic logic unit (ALU) may be used. As another example, a controller or processor may be used that executes instructions encoded in volatile memory (e.g., random access memory (RAM)) or in non-volatile memory (e.g., read only memory (ROM), programmable ROM, flash memory), etc.), or a combination of the two. Thus, a hardware, firmware, or software (or a mixture) approach may be used to implement the functionality of controller 20. The choice of implementation depends on a variety of factors, as persons of ordinary skill in the art will understand. Such factors include design specifications, performance specifications, cost, IC or device area, available technology, such as semiconductor fabrication technology, processing capability), degree of flexibility, target markets, target end-users, etc.

Figure 9:
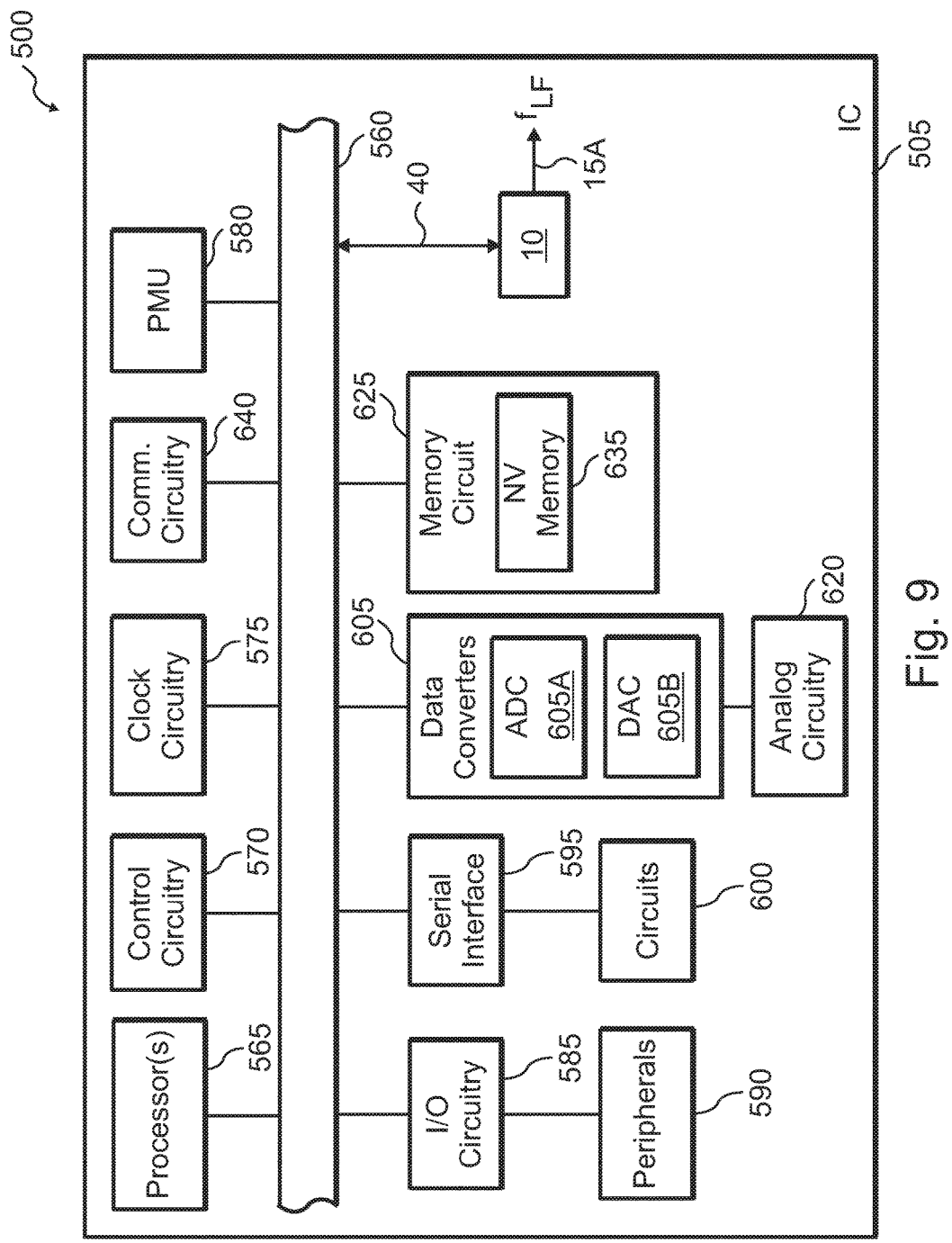
FIG. 9 illustrates a block diagram of a microcontroller unit (MCU) that includes signal generator circuitry according to an exemplary embodiment.

As noted above, in some embodiments, signal generator circuit 10 (or multiple signal generator circuits 10) may be associated with other circuitry, for example, integrated within an IC and coupled to other circuitry (whether within the IC or external to the IC). For example, in some embodiments, one or more signal generator circuits 10 may be included in an MCU. FIG. 9 shows circuit arrangement 500 for such a configuration.

Circuit arrangement 500 includes an IC 505, which constitutes or includes an MCU. IC 505 includes a number of blocks (e.g., processor(s) 565, data converter 605, I/O circuitry 585, etc.) that communicate with one another using a link 560. In exemplary embodiments, link 560 may constitute a coupling mechanism, such as a bus, a set of conductors or semiconductors for communicating information, such as data, commands, status information, and the like.

IC 505 may include link 560 coupled to one or more processors 565, clock circuitry 575, and power management circuitry or PMU 580. In some embodiments, processor(s) 565 may include circuitry or blocks for providing computing functions, such as central-processing units (CPUs), arithmetic-logic units (ALUs), and the like. In some embodiments, in addition, or as an alternative, processor(s) 565 may include one or more DSPs. The DSPs may provide a variety of signal processing functions, such as arithmetic functions, filtering, delay blocks, and the like, as desired.

Clock circuitry 575 may generate one or more clock signals that facilitate or control the timing of operations of one or more blocks in IC 505. Clock circuitry 575 may also control the timing of operations that use link 560. In some embodiments, clock circuitry 575 may provide one or more clock signals via link 560 to other blocks in IC 505.

In some embodiments, PMU 580 may reduce an apparatus's (e.g., IC 505) clock speed, turn off the clock, reduce power, turn off power, or any combination of the foregoing with respect to part of a circuit or all components of a circuit. Further, PMU 580 may turn on a clock, increase a clock rate, turn on power, increase power, or any combination of the foregoing in response to a transition from an inactive state to an active state (such as when processor(s) 565 make a transition from a low-power or idle or sleep state to a normal operating state), such as the states or modes of operation described above (EM0, EM1, EM2, EM3).

Link 560 may couple to one or more circuits 600 through serial interface 595. Through serial interface 595, one or more circuits coupled to link 560 may communicate with circuits 600. Circuits 600 may communicate using one or more serial protocols, e.g., SMBUS, I$^2$C, SPI, and the like, as person of ordinary skill in the art will understand.

Link 560 may couple to one or more peripherals 590 through I/O circuitry 585. Through I/O circuitry 585, one or more peripherals 590 may couple to link 560 and may therefore communicate with other blocks coupled to link 560, e.g., processor(s) 565, memory circuit 625, etc.

In exemplary embodiments, peripherals 590 may include a variety of circuitry, blocks, and the like. Examples include I/O devices (keypads, keyboards, speakers, display devices, storage devices, timers, etc.). Note that in some embodiments, some peripherals 590 may be external to IC 505. Examples include keypads, speakers, and the like.

In some embodiments, with respect to some peripherals, I/O circuitry 585 may be bypassed. In such embodiments, some peripherals 590 may couple to and communicate with link 560 without using I/O circuitry 585. Note that in some embodiments, such peripherals may be external to IC 505, as described above.

Link 560 may couple to analog circuitry 620 via data converter 605. Data converter 605 may include one or more ADCs 605A and/or one or more DACs 605B. The ADC(s) 605A receive analog signal(s) from analog circuitry 620, and convert the analog signal(s) to a digital format, which they communicate to one or more blocks coupled to link 560.

Analog circuitry 620 may include a wide variety of circuitry that provides and/or receives analog signals. Examples include sensors, transducers, and the like, as person of ordinary skill in the art will understand. In some embodiments, analog circuitry 620 may communicate with circuitry external to IC 505 to form more complex systems, sub-systems, control blocks, and information processing blocks, as desired.

Control circuitry 570 couples to link 560. Thus, control circuitry 570 may communicate with and/or control the operation of various blocks coupled to link 560. In addition, control circuitry 570 may facilitate communication or cooperation between various blocks coupled to link 560.

In some embodiments, control circuitry 570 may initiate or respond to a reset operation. The reset operation may cause a reset of one or more blocks coupled to link 560, of IC 505, etc., as person of ordinary skill in the art will understand. For example, control circuitry 570 may cause PMU 580, and circuitry such as signal generator circuit 10, to reset to an initial state.

In exemplary embodiments, control circuitry 570 may include a variety of types and blocks of circuitry. In some embodiments, control circuitry 570 may include logic circuitry, FSMs, or other circuitry to perform a variety of operations, such as the operations described above. In some embodiments, control circuitry 570 and controller 20 (not shown) of signal generator circuit 10 may share circuitry, or controller 20 may be included within control circuitry 570, as desired.

Communication circuitry 640 couples to link 560 and also to circuitry or blocks (not shown) external to IC 505. Through communication circuitry 640, various blocks coupled to link 560 (or IC 505, generally) can communicate with the external circuitry or blocks (not shown) via one or more communication protocols. Examples include USB, Ethernet, and the like. In exemplary embodiments, other communication protocols may be used, depending on factors such as specifications for a given application, as person of ordinary skill in the art will understand. In exemplary embodiments, radio frequency (RF) circuitry, such as receivers, transmitters, and/or transceivers may be used and included within communication circuitry 640.

As noted, memory circuit 625 couples to link 560. Consequently, memory circuit 625 may communicate with one or more blocks coupled to link 560, such as processor(s) 565, control circuitry 570, I/O circuitry 585, etc. Memory circuit 625 provides storage for various information or data in IC 505, such as operands, flags, data, instructions, and the like, as persons of ordinary skill in the art will understand. Memory circuit 625 may support various protocols, such as double data rate (DDR), DDR2, DDR3, and the like, as desired. In some embodiments, the memory read and/or write operations involve the use of one or more blocks in IC 505, such as processor(s) 565. A direct memory access (DMA) arrangement (not shown) allows increased performance of memory operations in some situations. More specifically, the DMA (not shown) provides a mechanism for performing memory read and write operations directly between the source or destination of the data and memory circuit 625, rather than through blocks such as processor(s) 565.

Memory circuit 625 may include a variety of memory circuits or blocks. In the embodiment shown, memory circuit 625 includes non-volatile (NV) memory 635. In addition, or instead, memory circuit 625 may include volatile memory (not shown). NV memory 635 may be used for storing information related to performance or configuration of one or more blocks in IC 505. For example, NV memory 635 may store configuration information related to signal generator circuit 10, as described above. Such configuration information may be used at desired times (e.g., upon reset or power on) to program various features and attributes of signal generator circuit 10 by programming configuration registers 35 (not shown).

Figure 10:
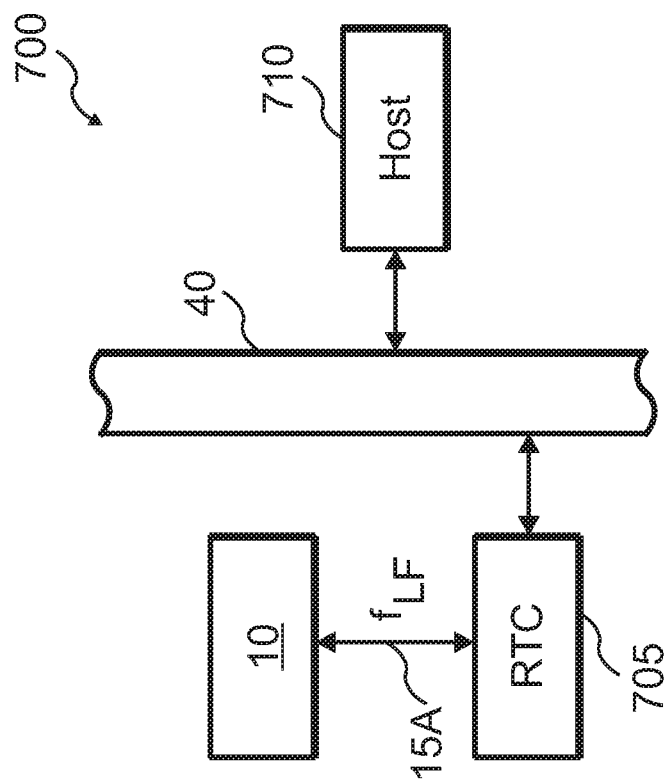
FIG. 10 depicts a circuit arrangement that includes a real time clock (RTC) circuit according to an exemplary embodiment.

As noted, in some embodiments, signal generator circuit 10 may be used in an RTC. The improved precision of LF oscillator 15 because of the calibration procedures described above results in better performance of the RTC. FIG. 10 depicts a circuit arrangement 700 that includes an RTC 705 according to an exemplary embodiment that includes signal generator circuit 10. RTC 705 couples to, and communicates with, host 710 via link 40.

Signal generator circuit 10 provides output signal 15A to RTC 705. RTC 705 uses output signal 15A as a reference signal to run a real time clock. For example, in some embodiments, output signal 15A may have a frequency of 32.768 kHz. RTC 705 may use a cascade of 15 divide by two stages to generate a 1 Hz signal from output signal 15A. The 1-Hertz signal, having a 1-second period, may then be used for timekeeping purposes.

RTC 705 may provide information, such has timing information (time of day, day of week, month, year, etc.) and/or alarm information, to host 710 via link 40. Host 710 may use link 40 to program signal generator circuit 10, RTC 705, or both, as desired. The improved precision of LF oscillator 15 (not shown) in signal generator circuit 10 by virtue of the calibration procedures described above improves the quality of the information that RTC 705 provides to host 710.

Various circuits and blocks described above and used in exemplary embodiments may be implemented in a variety of ways and using a variety of circuit elements or blocks. For example, controller 20, bit pattern generator 300, RTC 705, and host 710 may generally be implemented using digital circuitry. The digital circuitry may include circuit elements or blocks such as gates, digital MUXs, latches, flip-flops, registers, finite state machines (FSMs), processors, programmable logic (e.g., field programmable gate arrays (FPGAs) or other types of programmable logic), arithmetic-logic units (ALUs), standard cells, custom cells, etc., as desired, and as persons of ordinary skill in the art will understand. In addition, analog circuitry or mixed-signal circuitry or both may be included, for instance, power converters, discrete devices (transistors, capacitors, resistors, inductors, diodes, etc.), and the like, as desired. The analog circuitry may include bias circuits, decoupling circuits, coupling circuits, supply circuits, current mirrors, current and/or voltage sources, filters, amplifiers, converters, signal processing circuits (e.g., multipliers), detectors, transducers, discrete components (transistors, diodes, resistors, capacitors, inductors), analog MUXs and the like, as desired, and as persons of ordinary skill in the art will understand. The mixed-signal circuitry may include analog to digital converters (ADCs), digital to analog converters (DACs), etc.) in addition to analog circuitry and digital circuitry, as described above, and as persons of ordinary skill in the art will understand. The analog and/or mixed-signal circuitry may be used to implement LF oscillator 15, HF oscillator 25, and temperature sensor 30. The choice of circuitry for a given implementation depends on a variety of factors, as persons of ordinary skill in the art will understand. Such factors include design specifications, performance specifications, cost, IC or device area, available technology, such as semiconductor fabrication technology), target markets, target end-users, etc.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. An apparatus, comprising:
   a first oscillator to generate an output signal having a first frequency;
   a second oscillator to generate an output signal having a second frequency, wherein the second frequency varies a function of temperature; and
   a controller to count a number of cycles of the output signal of the second oscillator to determine whether to calibrate the first oscillator, wherein the controller comprises a bit pattern generator to generate a bit pattern used to calibrate the first frequency.

2. The apparatus according to claim 1, further comprising a third oscillator to generate an output signal having a third frequency, wherein the controller counts a number of cycles of the output signal of the third oscillator to calibrate the first oscillator.

3. The apparatus according to claim 1, wherein the first frequency is lower than the second frequency.

4. The apparatus according to claim 2, wherein the first frequency is lower than the third frequency.

5. The apparatus according to claim 1, wherein the second frequency has a higher sensitivity to temperature than the first frequency.

6. The apparatus according to claim 1, wherein the controller performs a base calibration of the first oscillator.

7. The apparatus according to claim 6, wherein the controller uses the count of the number of cycles of the output signal of the second oscillator to determine an amount of temperature change to determine whether to recalibrate the first oscillator.

8. The apparatus according to claim 7, wherein the controller applies a correction to the count of the number of cycles of the output signal of the third oscillator.

9. An apparatus, comprising:
   a first oscillator to generate an output signal having a first frequency;
   a second oscillator to generate an output signal having a second frequency, wherein the second frequency has higher sensitivity to temperature variation than the first frequency; and
   a controller to calibrate the first oscillator by counting a number of cycles of the output signal of a third oscillator when a number derived from variation in the second frequency exceeds a threshold.

10. The apparatus according to claim 9, wherein the controller determines whether variation in the second frequency exceeds the threshold by counting a number of cycles of the output signal of the second oscillator.

11. The apparatus according to claim 9, wherein the controller uses a bit pattern to trim the first frequency.

12. The apparatus according to claim 10, wherein the bit pattern is derived from a control word, and wherein the control word is determined from a count of a number of cycles of an output signal of the third oscillator.

13. The apparatus according to claim 9, wherein the output signal of the third oscillator has a third frequency that is higher than the first frequency.

14. A method of improving precision of a first oscillator, the method comprising:
   performing a base calibration of the first oscillator;
   using a second oscillator to determine whether a change in temperature exceeds a threshold; and
   recalibrating the first oscillator when the change in temperature exceeds the threshold by using a bit pattern to trim a frequency of an output signal of the first oscillator.

15. The method according to claim 14, wherein performing the base calibration of the first oscillator comprises counting a number of cycles of an output signal of a third oscillator, wherein the output signal of the third oscillator has a third frequency that is higher than the frequency of the output signal of the first oscillator.

16. The method according to claim 15, wherein the first oscillator generates an output signal having a first frequency, and wherein the firsts frequency is lower than the third frequency.

17. The method according to claim 14, wherein using the bit pattern to trim the frequency of the output signal of the first oscillator further comprises causing a period of the output signal of the first oscillator to vary to compensate for changes in temperature.

18. The method according to claim 14, wherein using the second oscillator to determine whether the change in temperature exceeds the threshold comprises counting a number of cycles of the output signal of the second oscillator.

19. The method according to claim 14, wherein the second oscillator generates an output signal having a second frequency, and wherein the second frequency has a higher sensitivity to temperature than the frequency of the output signal of the first oscillator.

20. The apparatus according to claim 1, wherein the controller uses the bit pattern to trim the first frequency.

* * * * *